US 6,625,179 B1
(12) United States Patent
Doetsch et al.

(10) Patent No.: US 6,625,179 B1
(45) Date of Patent: Sep. 23, 2003

(54) METHOD FOR TRANSMITTING DATA IN A DIGITAL TRANSMISSION SYSTEM GIVEN A PACKET-SWITCHED SERVICE

(75) Inventors: Markus Doetsch, Koblenz (DE); Jörg Plechinger, München (DE); Peter Jung, Otterberg (DE); Friedbert Berens, Kaiserslautern (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/486,248
(22) PCT Filed: Jul. 29, 1998
(86) PCT No.: PCT/DE98/02167
§ 371 (c)(1),
(2), (4) Date: Feb. 22, 2000
(87) PCT Pub. No.: WO99/11011
PCT Pub. Date: Mar. 4, 1999

(30) Foreign Application Priority Data

Aug. 22, 1997 (DE) .......................... 197 36 626

(51) Int. Cl.$^7$ ................................ H04L 1/18
(52) U.S. Cl. ........................ 370/529; 370/252
(58) Field of Search ................. 370/333, 529, 370/252, 253; 714/751, 755, 774; 455/522; 375/262

(56) References Cited

U.S. PATENT DOCUMENTS

| | | | | |
|---|---|---|---|---|
| 5,983,384 A | * | 11/1999 | Ross | 714/755 |
| 6,126,310 A | * | 10/2000 | Osthoff et al. | 714/751 |
| 6,138,260 A | * | 10/2000 | Ketseoglou | 714/751 |
| 6,272,183 B1 | * | 8/2001 | Berens et al. | 375/262 |
| 6,298,242 B1 | * | 10/2001 | Schiff | 455/522 |
| 6,304,991 B1 | * | 10/2001 | Rowitch et al. | 714/755 |
| 6,308,294 B1 | * | 10/2001 | Ghosh et al. | 714/751 |
| 6,370,669 B1 | * | 4/2002 | Eroz et al. | 714/774 |
| 6,381,232 B1 | * | 4/2002 | Strawczynski et al. | 370/333 |

FOREIGN PATENT DOCUMENTS

WO  WO 99/11011  3/1999

OTHER PUBLICATIONS

XP 000687091—A Novem ARQ Technique using the Turbo Coding Principle, Narayanan et al., pp. 49–51 (3/97).
XP 002091099, New Results on the Application of Antenna Diversity and Turbo–Codes in a JD–CDMA Mobile Radio System, Nabhan et al., pp. 524–528 (1994.
XP 000586080, Comparison of Turbo–Code Decoders Applied to Short Frame Transmission Systems, Jung, pp. 530–537 (4/96).
XP 000736764 Physical Layer Design for Packet Data over IS–136, Narayanan et al., pp. 1029–1033 (3/97).
Turbo Codes for PCS Applications, Divsaler et al. (6/95).
Iterative Correction of Intersymbol Interference: Turbo–Equalization, Douillard et al., (1/95).
Near Shannon Limit Error—Correcting Coding and Decoding: Turbo–Codes (1), Berrou et al., pp. 1064–1070 2/93.

\* cited by examiner

*Primary Examiner*—Salvatore Cangialosi
(74) *Attorney, Agent, or Firm*—Bell, Boyd & Lloyd LLC

(57) ABSTRACT

In a method for transmitting data in a digital transmission system given packet-switched service, for purposes of channel coding, a turbo-coding is performed in a turbo-coder at the sender side and a turbo-decoding with soft decision output signals is performed in a turbo-decoder at the receiver side. To trigger an ARQ, the channel quality is estimated by a parameter estimation method; the variances of the soft decision output signals at the turbo-decoder are determined; the correctness or respectively, defectiveness of the transmitted packet is inferred from the channel quality and the variances; and a retransmission of at least a part of defective packet is triggered. In the retransmission of the information of a defective packet, at least part of the information suppressed by the dotting in the precious transmission is sent. This additional information is [. . .] inserted into the already existing information at the receiver side, and this complete information is decoded again.

11 Claims, 5 Drawing Sheets

METHOD FOR TRANSMITTING DATA IN A DIGITAL TRANSMISSION SYSTEM GIVEN A PACKET-SWITCHED SERVICE

The present invention relates to a method for digital transmission in a digital transmission system given packet-switched service wherein for purposes of channel coding a turbo-coding is performed in a turbo-coder at the sender side and a turbo decoding is performed in a turbo-decoder at the receiver side with soft decision output signals.

DESCRIPTION OF THE PRIOR ART

P. Jung's "Comparison of Turbo-Code Decoders Applied to Short Frame Transmission Systems" (IEEE Journal on Selected Areas in Communications, Vol. 14 (1996) :530–537) examines the application of turbo-codes for digital transmission systems, wherein both coders and decoders for the turbo-codes in the transmission path are examined. The decoding of the turbo-codes is based on the use of soft-input/soft-output decoders, which can be perform either using MAP (Maximum a-posteriori) symbol estimators or using MAP sequence estimators, for instance using an estimator having an a priori soft output Viterbi algorithm (APRI-SOVA). In this publication, four different decoder arrangements and their abilities to process defined error rates are described. In addition, the performance of these decoders in different instances of application is examined. It is established that turbo-codes and their iterative decoding are [sic] an effective measure against packet errors.

In "Turbo-codes for BCS Applications" (D. Divsalar and F. Pollara, ICC '95, Seattle, Wash., Jun. 18–22, 1995), turbo-codes are suggested in order to achieve error correction nearly reaching what is known as the Shannon limit. For this purpose, relatively simple component codes and large interleavers should be used. In this publication,the turbo-codes are generated in a coder having a plurality of codes and are decoded in a suitable decoder. The turbo-codes were introduced by Berrou et al in 1993 (see C. Berrou, A. Glavieux and P. Thitimayshima, "Near Shannon Limit Area Correction Coding; Turbo-codes", Proc. 1993 IEE International Conference on Communications: 1064–1070). A rather effective error correction can be achieved with this method.

"Iterative Correction of Intersymbol Interference: Turbo-Equalization" (Catherine Douillard, ETT European Transactions on Telecommunications, Vol. 6, No. 5, September–October 1995) teaches what is known as turbo-equalization, with which it is intended to eliminate the adverse effects of the intersymbol interference in digital transmission systems which are protected by convolution codes. The receiver executes two consecutive soft output decisions, which are carried out by a symbol detector and a channel decoder via an iterative process. In each iteration, extrinsic information from the detector and the decoder is used in the next iteration and in the turbo-decoding [sic]. It is demonstrated that intersymbol interference effects in multi-path channels can be overcome with turbo-equalization.

Methods for linking turbo-coding, ARQ (Automatic Repeat Request) and radio systems are taught by Narayanan, K. R>("A Novel ARQ Technique Using the Turbo-Coding Principle; IEEE Communications Letters, vol. 1, Nr. 2, March 1997:49–51) and by Naddhan, M. ("New Results on the Application of Antenna Diversity and Turbo-codes in a JD-CDMA Mobile Radio System; 5$^{th}$ IEEE International Symposium on Personal, Indoor and Mobile Radio Communications (PIMRC '92) and ICCC Regional Meeting on Wireless Computer Networks (WCN), The Hague, Netherlands, vol. 2, Sept. 18–23, 1994:524–528).

Future transmission systems such as the European UMTS (Universal Mobile Telecommunications System) require the support of a number of coexisting carrier services having carrier data rates of up to 2 Mbit/s in a flexible manner, whereby the best possible spectral efficiency is desired. In ACTS (Advanced Communications Technologies and Services) Project AC090 FRAMES (Future Radio wide-bAnd Multiple accEss Systems), an MA (Multiple Access) schema called FRAMES Multiple Access (FMA) was developed that satisfies the requirements of UMTS. As a transmission system of the third generation, which includes a wide range of fields of application, carrier services and various scenarios, FMA must satisfy [sic] present and future developments of UMTS radio interface standards. FMA includes two operating modes, namely WB-TDMA (Wideband Time Division Multiple Access) with and without spreading and compatibility with GSM (Global System for Mobile Communications), and WB-CDMA (Wideband Code Division Multiple Access). Although the system considered here is basically according to FMA, it also is possible to include other transmission systems having multiple access methods, such as FDMA (Frequency Division Multiple Access) or MC-CDMA (Multicarrier CDMA) or combinations of these transmission systems.

In view of the high performance of turbo-codes, it is desirable to use them in digital transmission systems. But the diverse requirements in FMA, for instance, make it necessary to take care when such turbo-codes are used that the data transmission is not loaded too heavily by the transmission of error correction codes.

It is an object of the present invention, to make available the a [sic] method for packet transmission with an ARQ protocol on transmission channels in a digital transmission system wherein a turbo-coding is used for channel coding, wherein is possible to keep the channel load due to ARQ optimally small by means of a new turbo-code and a dotting that is tuned thereto.

SUMMARY OF THE INVENTION

The above-described method is inventively achieved wherein in order to trigger an ARQ:

the channel quality is estimated by a parameter estimation method that is known per se, the variances of the soft decision output signals at the turbo-decoder are determined, the correctness or, respectively, defectiveness of the transmitted packet is inferred from the channel quality and the variances, and a retransmission of at least a part of a defective packet is triggered.

Previously, an ARQ was triggered in that the data packet to be sent was protected by a suitable error-detecting coding such as CRC (Cyclic Redundancy Check). Defective data blocks then could be detected in the receiver by this type of coding and could be re-requested. A disadvantage of this method is that the error-detecting coding generates additional redundancy bits with which it is not possible to transmit information. In contrast, the inventive method possesses the advantage that the estimation of the quality of service can be applied for purposes of triggering the ARQ. As is laid out in A detail below, for decoded block it is possible to make an unambiguous statement about the correctness of the block, or, respectively, of the packet dependent on the channel quality with the aid of the computed variance, for instance, of the LLRs. One of the known parameter estimating methods, such as MMSE (Minimum Means Square Error Estimation), MOM (Method of Moments) or MVU (Minimum Variance Unbiased Estimation) is used to estimate the channel qualities for this purpose. The error-detecting coding of the data packet is, thus, inventively omitted. This increases both the overall coding rate on the transmission channel and the share of the payload information contained in the packet as well. In addition, the computing outlay for the decoding is reduced. As such, the delay that is generated by the decoding of the error detecting portion is reduced as well.

The term "quality of service" is used here in the following sense: For different services, defined QoS criteria (QoS= Quality of Service ) apply, and the definitions of the QoS criteria for different carrier services have been worked out in the context of FRAMES. An important component of a QoS criterion is the carrier data rate R. The QoS criterion also includes maximum allowable error rate $P_b^G$ or a packet loss rate $P_l^G$ in combination with a maximum probability of failure $P_{out}^G$. In the case of power-switched services, the probability $P\{P_b > P_b^G\}$ that the instantaneous bit error rate $P_b$ exceeds $P_b^G$ must not be greater than $P_{out}^G$, that is $$Pr\{P_b > P_b^G\} < P_{out}^G.$$

In voice transmission $P_b^G$ equals $10^{-3}$ and $P_{out}^G$ equals 0.05. In packet services a similar condition holds for the instantaneous packet loss rate $P_l$:

$$Pr\{P_l > P_l^G\} < P_{out}^G.$$

Besides the criteria relating to Pr, there are additional conditions in the context of the QoS criterion. Mainly the QoS parameters $P_b^G$, $P_l^G$ and $P_{out}^G$ that are directly related to the selection of the error correction code (ECC) are considered here, however. In ECC, the coding rate $R_c$ is essentially determined by the multiplex method, the modulation and the packet parameters. In other words, the coding rate $R_c$ has a direct connection to the question of whether or not a QoS criterion for a specific service is satisfied.

In a method in which a soft input/soft output symbol estimator or sequence estimator is used at the receiver side, it is advantageous when the quality of service is determined from the variances $\sigma^2$ of the soft decision output signals of the turbo-decoder, wherein the bit error rates are computed from the variances $\sigma^2$ as a measure of the quality of service.

In a method in which an MAP symbol estimator or an MAP sequence estimator is used at the receiver side, it is advantageous when the quality of service is determined from the variances $\sigma^2_{LLR}$ of the soft decision output signals of the turbo-decoder.

In a method in which a Viterbi algorithm is used for sequence estimation at the receiver side, it is advantageous when the quality of service is determined from the variances $\sigma^2_{VIT}$ of the soft decision output signals of the turbo decoder.

Since the inventive method can be used either given MAP estimators or given an estimation by a Viterbi algorithm, there is practically no restriction with respect to the most important method of sequence and symbol estimation. This is true, although in Th the specific description below, this statement is only substantiated in the context of an MAP symbol estimator.

According to an advantageous development of the present invention, the method is characterized in that what is known as Berrou's dotting is used for the dotting, in which only the non-systematic information is dotted. This type of dotting is advantageous given lower values of the signal/noise ratio.

According to a further development, the inventive method is characterized in that what is known as UKL dotting is used for the dotting, in which both the systematic information and the non-systematic information are dotted. This type of dotting is advantageous given higher signal/noise ratios and thus given bit rates of $<10^{-4}$.

In another embodiment, the inventive method is characterized in that an RCPTC is used as turbo-code. As can be seen in the detailed description, a code of this type is particularly flexible and is suited to the objects of the present invention. The RCPTC enables the transition from fixed ECC strategies to flexible ECC strategies, the latter being adapted to requirements which vary over time, so that a flexible link layer control and medium access control are possible.

Pursuant to a further developement the inventive method is characterized in that in a retransmission of the information of a defective packet at least a part of the information suppressed by the dotting of the RCPTC in the previous transmission is sent, and that this additional information is inserted into the already existing information at the receiver side, and this complete information is decoded again. In this way, the channel is loaded as little as possible in the use of an ARQ method.

In yet another embodiment, the inventive method is characterized in that in the retransmission only those bits are sent which are additionally available at the next lowest coding rate, since they are not dotted. In this way, only the minimum information required in order to achieve the object of an adequate transmission quality is transmitted.

Moreover, another development of the inventive method is characterized in that the method is repeated until an errorless decoding of the packet has been achieved or until the all the coded information of a packet has been transmitted. In this way, the entire potential of the coding is exhausted in order to correct the errors in a packet.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
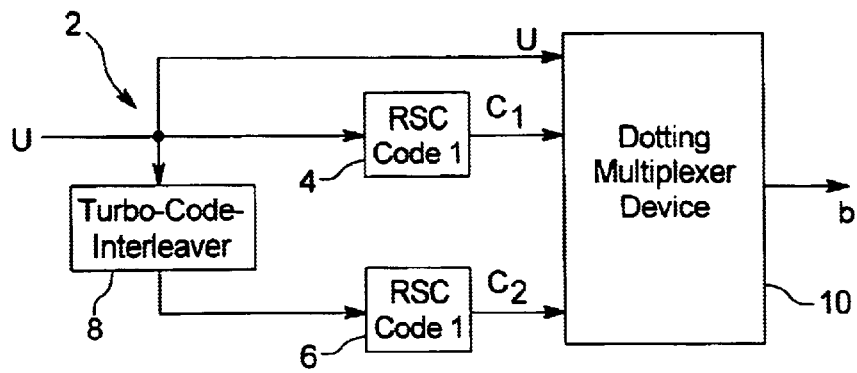
FIG. 1 shows a block diagram of a turbo-coder.

With a view to an economical use of hardware, it should be possible to use the ECC circuit optimally universally, while the ECC configuration should permit a high flexibility based on software control. The RCPTC used here makes this possible, because it includes the necessary flexibility. The RCPTC can be generated with the turbo-coder 2 illustrated in FIG. 1. The turbo-coder 2, includes $N_c=2$ binary, recursive, systematic convolution coders 4,6 (RSC) having a small constraint length, for instance between 3 and 5, which are connected in parallel fashion upon utilization of a turbo-interleaver 8. The input sequence u is fed to the coder 4 (RSC, code 1) and via the turbo-code interleaver 8 to the coder 6 (RSC, code 2) as well as to a dotting/multiplexer 10. The dotting/multiplexer 10 gets an additional input C1 from the coder 4 and an additional input C2 from the coder 6. The output of the dotting/multiplexer 10 is the output sequence b.

In the turbo-coder 2, the minimal code rate $R_c$, min equals $1/(N_{e-1})=1/3$. The minimal coding rate $R_c$, min could be further reduced in that additional RSC coders are employed.

The binary input sequence u, which has a finite time period, is inputted into the coder 4 and delivers the redundancy sequence $C_1$ at its output with the same finite duration as u. The sequence $u_I$ that represents the sequence u subsequent to interleaving is delivered to the coder 6. The coding in the coder 6 produces the redundancy sequence $C_2$. The redundancy sequences $C_1$ and $C_2$ and the sequence u are dotted and multiplexed in order to form the output sequence b. The turbo-coder is a systematic coder, u being the basis of the systematic information contained in b.

Figure 2:
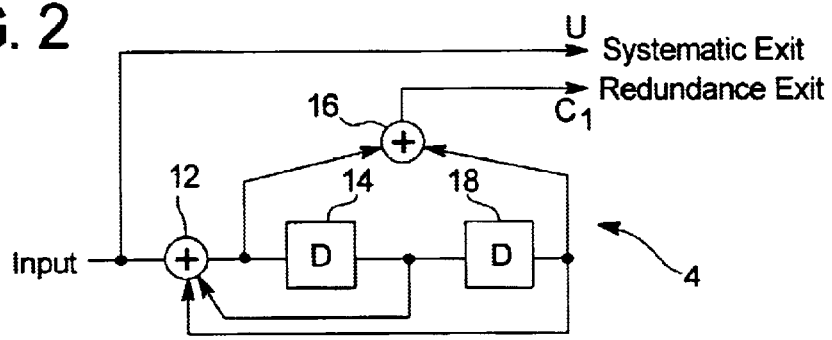
FIG. 2 shows a block diagram of an RSC coder as it is used in a turbo-coder as illustrated in FIG. 1.

An RSC coder such as can be used for the coders 4 and 6 is illustrated in FIG. 2 in the example of the coder 4. The sequence u stands pending at the input of the coder 4 as systematic information. Via an adding element 12, the sequence u reaches a delay stage 14 and an additional adding element 16. The output signals of the delay stage 14 go to a second delay stage 18 and to the adding element 12. The output signals of the second delay stage 18 go to the adding stage 12 and the adding stage 16. The output of the adding stage is then the redundancy sequence $c_1$.

The cost of hardware plays an important role in the selection of this coder, which should be kept as low as possible. For this reason the two RSC coders to be used in the context of FRAMES are identical and have a constraint length of 3. Although these RSC coders have only four states, they exhibit good performance given low values of the signal/noise ratio $E_b/N_0$. The performance of the RCPTC with these coders is therefore advantageous given low signal/noise ratios.

Figure 3:
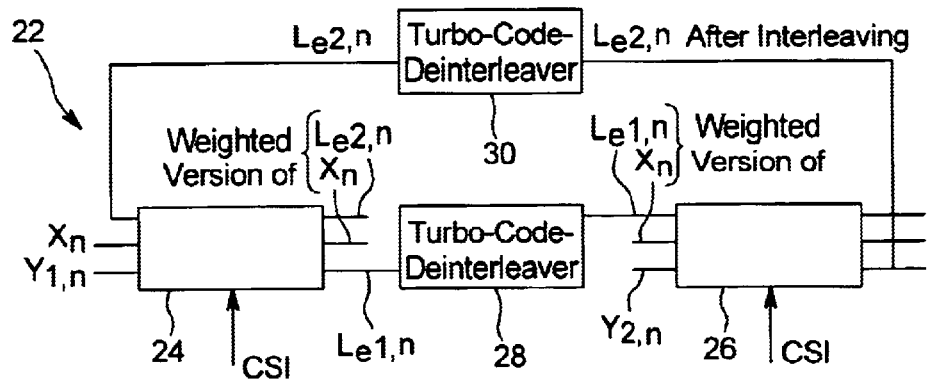
FIG. 3 shows a block diagram of a turbo-decoder.

The output sequence b of the turbo-coder 2 reaches the turbo decoder 22, which decoder includes an RSC decoder 24 and a second RSC decoder 26, via the transmission channel and a demodulator (FIG. 3). A turbo-code interleaver 28 is provided between an output of the decoder 24 and an input of the decoder 26. A turbo-code interleaver 30 is provided between an output of the decoder 26 and an input of the decoder 24. The decoders 24, 26 are soft input/soft output decoders.

The demodulator (not illustrated) delivers assessed values $x_n$ of the systematic information un that are contained in u as well as assessed values $y_{1,n}$ and $Y_{2,n}$ of the transferred redundancy bits that have been generated by the coders 4 or, respectively, 6. The two decoders 24, 26 require an item of channel state information (CSI) consisting of the instantaneous signal amplitudes and the noise variance. Each of the decoders 24,26 processes the systematic information, the redundancy and a priori information $L_{e1,n}$ and $L_{e2,n}$ upon the processing of the CSI, wherein the extrinsic information $L_{e2,n}$ and $L_{e1,n}$ are generated, which are then used as a priori knowledge in the subsequent decoder. The decoding is iterative, and the result of the decoding is improved with each iteration. The measure of the improvement gradually decreases with further iteration. After a certain number of iterations the output signal of the turbo decoder 22 is fed to a detector (not illustrated), as is common in transmission systems of this type.

In order to adapt the use of the RCPTC to the present service requirements, it would be possible to modify the RSC coder, but this would lead to an undesirable additional load in terms of the hardware costs. The adaptation of the size of the interleaver to the specific services is known per se and also presents a problem given the use of an RCPTC due to its flexibility. [sic]

Furthermore, the number of iterations in the decoding can be adjusted according to the QoS criterion in consideration of the overall coding complexity. Two possibilities to exploit this characteristic of the turbo-code are present at the receiver. For a prespecified QoS criterion, the number of iterations can be increased with a rising signal/noise ratio $E_b/N_0$. This is particularly advantageous in fading channels, such as in transmission channels. On the other hand, the number of iterations also can be varied with a time-variant QoS criterion. It is possible to adjust the number of decoding iterations only when turbo-codes are used, particularly an RCPTC.

Another possibility for improving the performance in a system with an RCPTC is to adjust the dotting so that an RCPTC with varying code rates $R_{C,min}<=R_C<=R_{C,max}$ can be made available, making it possible to modify the coding characteristics without adapting turbo-code interleavers or RSC coders.

Basically, the sequences u, $c_1$ and $c_2$ are available for the dotting. When two of the sequences are entirely suppressed by dotting, the maximum code rate $R_{c,max}=1$ is assumed. In this case, the coding charactreristics depend on which of the sequences are dotted. If, for example, the redundancy sequences $c_1$ and $c_2$ are completely dotted, whereby only the sequence u is let through unmodified, then an ECC cannot be obtained and time diversity gains are not achievable at the receivers in fading channels. In this case, the turbo-decoder is reduced to a simple threshold detector.

When one of the redundancy sequences $C_1$ or $C_2$ is completely suppressed by the dotting, whereby only the other redundancy sequence can pass through together with the sequence u, the turbo-coder becomes a conventional RSC coder. The turbo decoder is reduced to an RSC decoder that is used for purposes of carrying out a half-iteration. In this case, there is no a priori knowledge based on extrinsic information. The coding rate $R_c$ can be varied between ½ and 1, according to the QoS criterion. Since $N_c=2$ applies, the RSC coders can be based on two different codes, and the QoS criterion and the coding complexity can be varied in that a defined redundancy sequence $C_1$ or $C_2$ is suppressed without altering the coding rate $R_C$.

But the above-mentioned possibilities prevent a turbo-code operation that is available only when bits of both redundancy sequences $C_1$ and $C_2$ are transmitted and the relation $u_n \neq u_{1,n}$ applies, $u_n$ and $u_{1,n}$ being contained in u, or respectively, $u_1$. In this case, the relation $$R_{c,min} <= R_c < 1$$

applies.

The minimal coding rate $R_{c,min}=1/(N_e+1)$ is achieved when dotting is not performed. In this case, either the conventional RSC decoding or the turbo-decoding can be used, depending on the QoS criterion and the transmission channel state, both of which factors vary over time in transmission applications.

The following variants are possible in pure turbo-code operation: The sequence u is not dotted; the redundancy sequences $c_1$ and $c_2$ are partially dotted. In this case, an operation as RSC code or as turbo-code is possible; the number of decoding iterations is adjustable; and the coding rate can lie between ⅓ and 1. This type of dotting is called Berrou's dotting.

An alternative possibility consists in the sequence u and the redundancy sequences $c_1$ and $c_2$ being partially dotted. In this case, an operation is not possible with RSC code; rather, only with a turbo-code. The number of decoding iterations is adjustable, and the coding rate can lie between ⅓ and 1. This type of dotting is called UKL (University Kaiserslautern) dotting. Lastly, it also is possible to consider a case in which no dotting takes place. In this case, the operation is possible with an RSC code and a turbo-code. Th number of decoding iterations is adjustable and the coding rate is ⅓.

The advantageous feature in RCPTC lies in the ability to adaptively modify the coding rate $R_c$, it being possible to transfer the required information in an ARQ without having to transfer the entire coded packet. It is sufficient to transfer an additional part of the information that compensates the difference in the coding rate.

Now that the possibilities for adjusting the coding in the case of RCPTC have been described, the effects of the adjustment possibilities on the performance of the system given the use of RCPTC are described with the aid of simulations.

Figure 4:
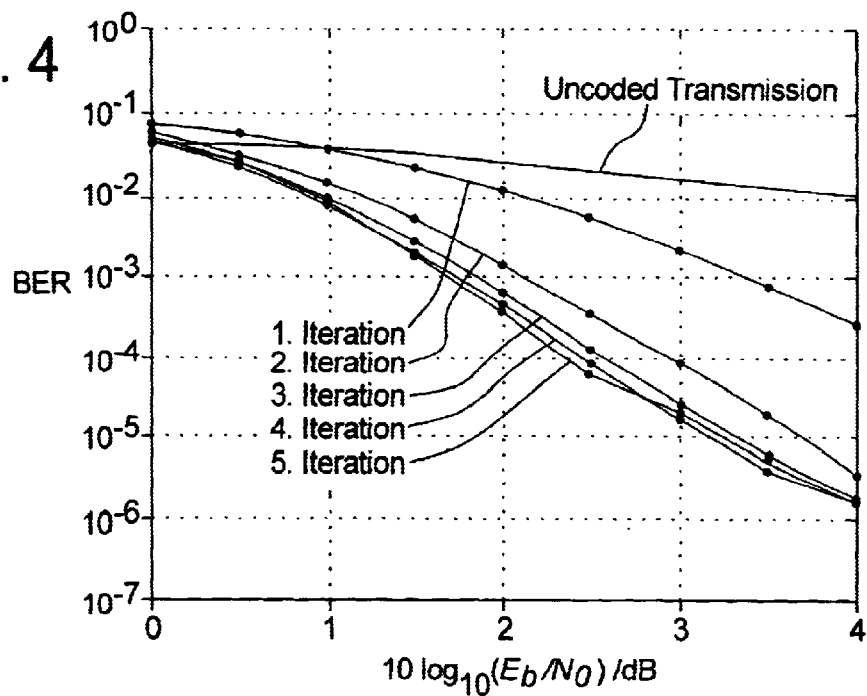
FIG. 4 shows a graphic illustration of the performance of an RCPTC in an AWGN channel as a function of the number of iterations in the turbo-decoding.

FIG. 4 depicts the performance of the RCPTC in a graphic representation wherein the bit error rate BER is depicted in relation to the signal/noise ratio $_{Be}/N_0$ for a voice transmission over an AWGN channel. The packet size was 150 bits, and the coding rate approximately ⅓. The carrier data rate for the voice transmission amounted to 8=kbit/s. The uncoded transmission is depicted as reference line. The parameter of these simulations is the number of decoding iterations, which varies between 1 and 5. After the first decoding iteration, the minimum signal/noise ratio that is required in order to achieve a bit error rate of $<10^{-3}$ is approximately equal to 3.5 dB. After the second decoding iteration, approximately 1.3 dB less are required. The next decoding iteration enables a further gain of 0.2 dB. The next iteration enable [sic] gains of less than 0.1 dB. After five iterations the minimal signal/noise ratio required for a bit error rate of less than $10^{-3}$ is approximately equal to 1.8 dB. Accordingly, it can be seen that the performance improvement grows smaller with increasing iterations. By comparison, a conventional NSC code with a constraint length of 9 requires approximately 1.9 dB in order to achieve the same bit error rate of $<10^{-3}$. The RCPTC is, thus, somewhat more powerful than conventional codes even given packet sizes as small as 150 bits.

Figure 5:
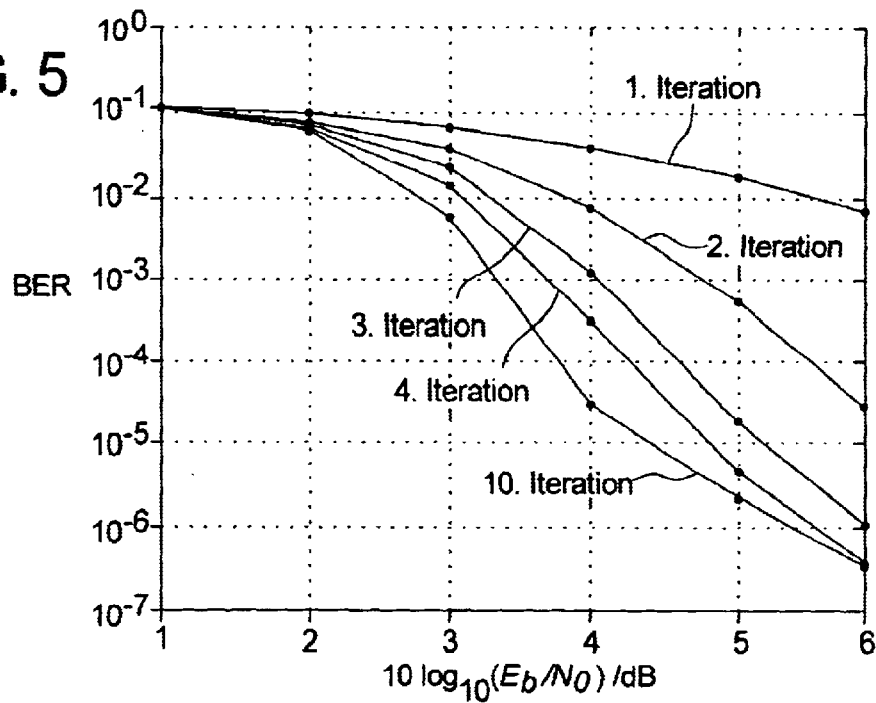
FIG. 5 shows a graphic representation of the performance of an RCPTC in a Rayleigh channel given a different number of iterations in the turbo-decoding.

FIG. 5 depicts the performance of the RCPTC in a graphic representation wherein the bit error rates BER is depicted in relation to the signal/noise ratio $B_{E/N0}$ for narrowband ISDN given a carrier data rate of 144 kbit/S, a packet size of 672 bits, a code rate of approximately ½ and a Rayleigh fading channel that undergoes interleaving completely. The simulation parameter is again the number of decoding iterations. After four decoding iterations a bit error rate of less than $10^{-3}$ requires a minimum signal/noise ratio of 3.8 dB. After ten iterations, only approximately 3.4 dB are still required. A conventional NSC code having a decoding complexity similar to four decoding iterations has a constraint length of 8 and requires a signal/noise ratio that is 1.1 dB higher.

Figure 6:
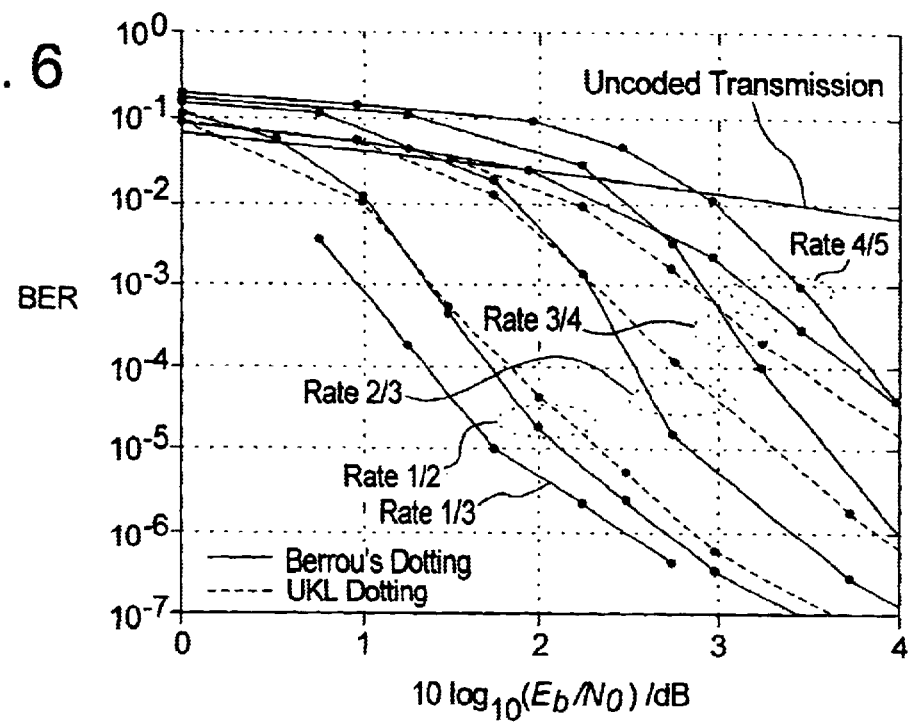
FIG. 6 shows graphic representation of the performance of an RCPTC in an AWGN channel as a function of different coding rates.
Figure 7:
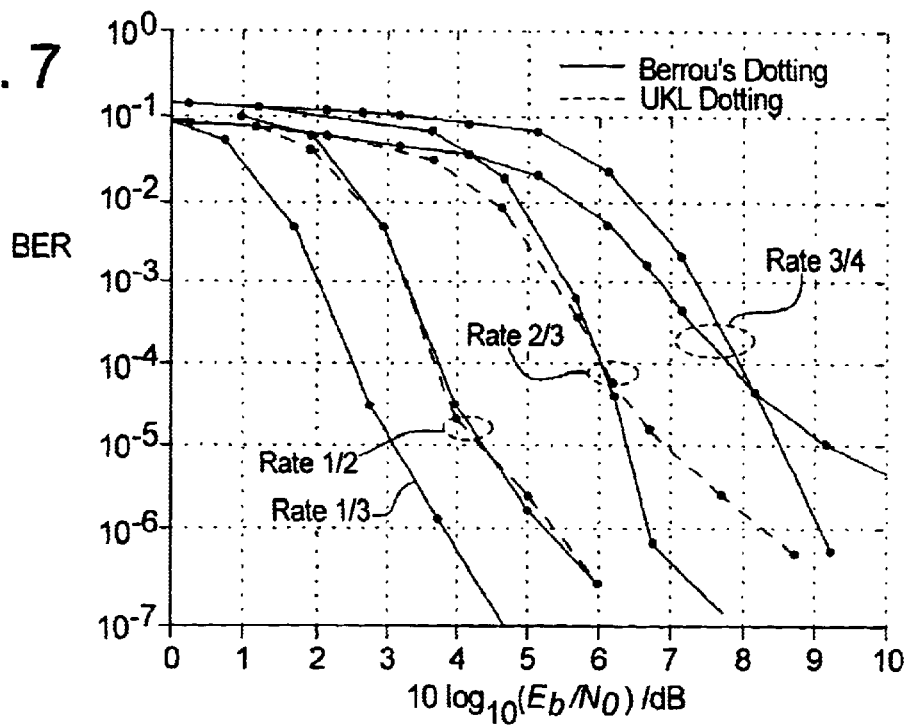
FIG. 7 shows graphic representation of the performance of an RCPTC in a Rayleigh channel as a function of different coding rates.
Figure 8:
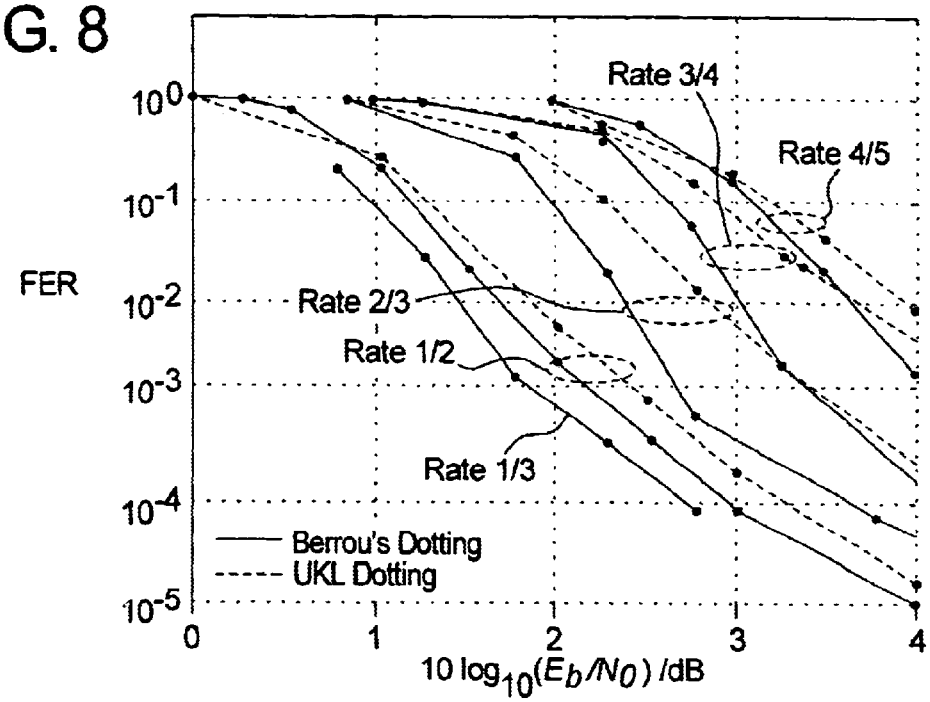
FIG. 8 shows graphic representation of the performance of an RCPTC in an AWGN channel for different coding rates.
Figure 9:
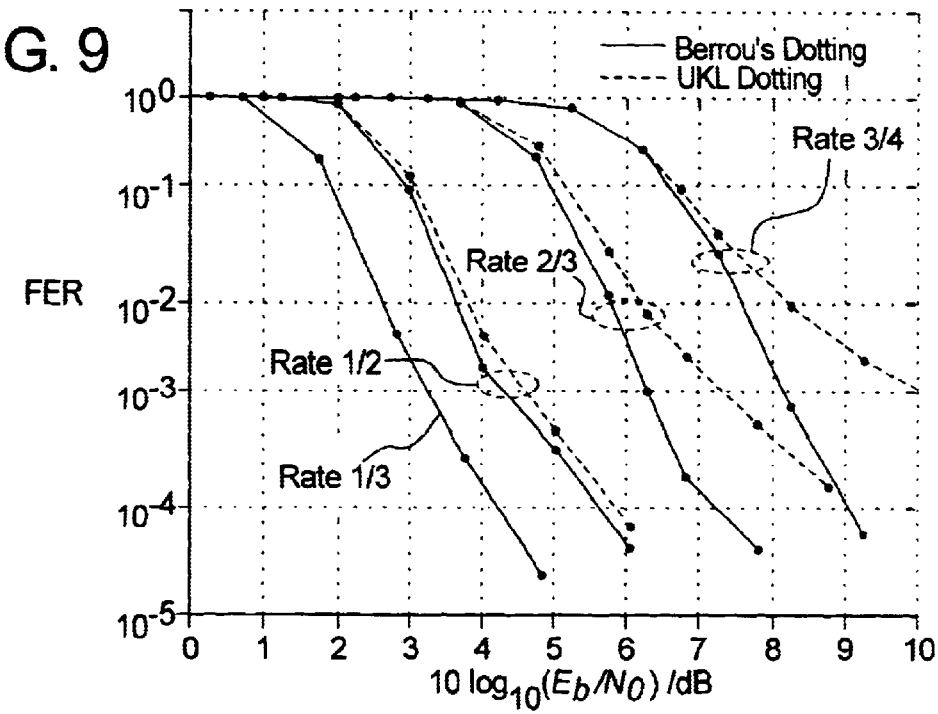
FIG. 9 shows graphic representation of the performance of an RCPTC in a Rayleigh channel given different coding rates.

FIGS. 6 to 9 are graphic representations for the performance given use of RCPTC whereby the bit error rate BER or, respectively, the frame error rate FER is plotted in relation to the signal/noise ratio $E_B/N_0$. FIG. 6 depicts the bit error rate in realtion to the signal/noise ratio given a packet size of 672 bits, ten decoding iterations and an AWGN channel. FIG. 7 depicts the bit error rate in relation to the signal/noise ratio given a packet size of 672 bits, ten decoding iterations and a Rayleigh fading channel that undergoes an interleaving completely. FIG. 8 depicts the frame error rate FER in relation to the signal/noise ratio given a packet size of 672 bits, ten decoding iterations and an AWGN channel. FIG. 9 depicts the frame error rate in relation to the signal/noise ratio given a packet size of 672 bits, 10 decoding iterations and a Rayleigh fading channel that is completely subjected to an interleaving. In the graphic representations of FIGS. 6 to 9, two different dotting methods are used; namely, Berrou's dotting and UKL dotting, which were mentioned above. It is clear that Berrou's dotting performs better given lower values of the signal/noise ratio, while UKL dotting is advantageous given a high signal/noise ratio and, thus, given error rates of $<10^{-4}$. The crossings move in the direction of lower bit error rates as the coding rate rises.

Figure 10:
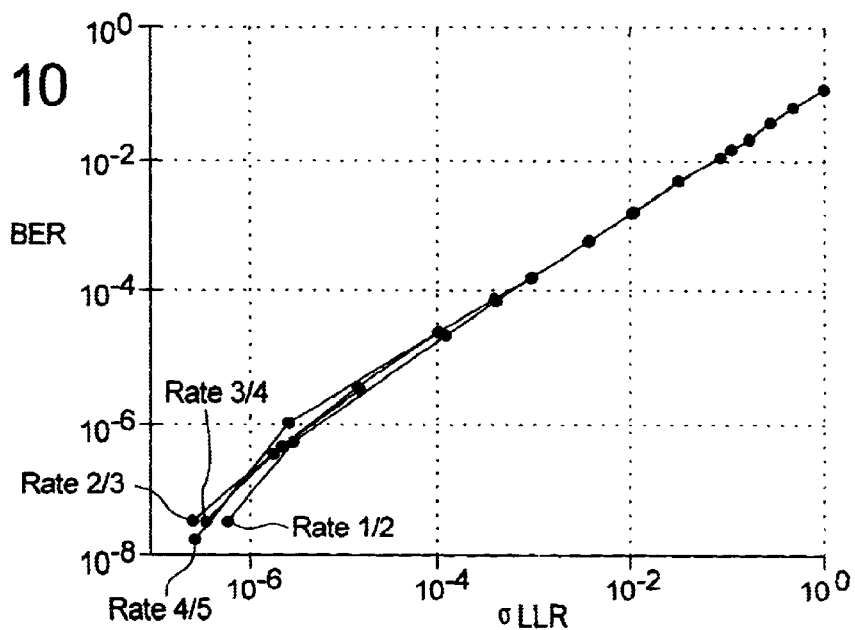
FIG. 10 shows graphic representation of the performance of the relation between the bit error rate BER and the variance $\sigma^2_{LLR}$ at the output of the second decoder.

FIG. 10 depicts the bit error rate in relation to the variance of the log-likelihood ratios (LLR) at the output of the second decoder, whereby an RCPTC, a packet size of 372 bits, ten decoding iterations and an AWGN channel are assumed. FIG. 10 clearly shows that the coding rate does not have any influence on the relation between the bit error rate and the variance $\sigma^2_{LLR}$, since both these quantities have a similar dependence on the signal/noise ratio $B_E/N_0$. It is therefore simple to perform an estimation of the bit error rate when $\sigma^2_{LLR}$ is known, the result of which can serve as a basis for action, for instance for adapting the decoding iteration number or the coding rate in order to improve the transmission quality or, in the case of ARQ, in order to request a resending of a defectively coded packet.

Figure 11:
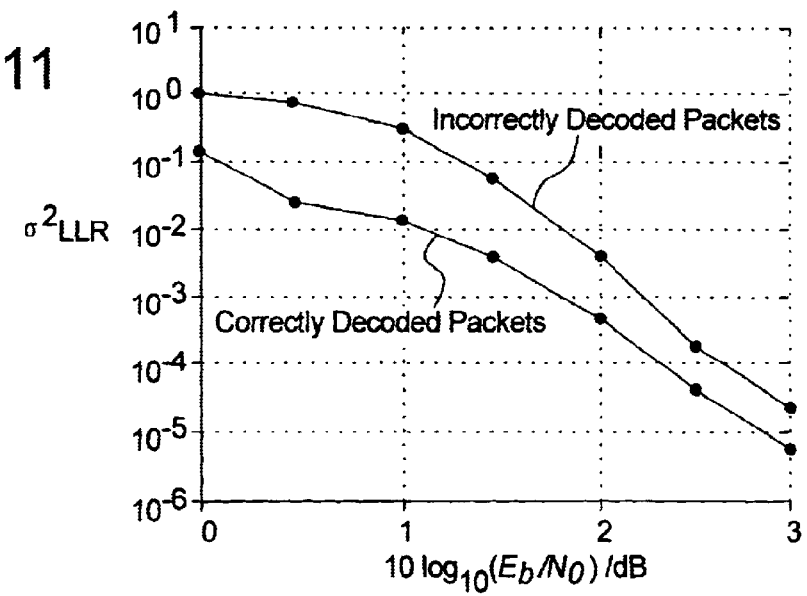
FIG. 11 shows a graphic representation of the variance $\sigma^2_{LLR}$ in relation to the signal/noise ratio in defectively decoded, or, respectively, correctly decoded packets.

Lastly, FIG. 11 depicts the variance $\sigma^2_{LLR}$ of the log-likelihood ratio LLR at the output of the second decoder in relation to the signal/noise ratio $B_E/N_0$ given the use of RCPTC with a packet size of 600 bits, a coding rate of approximately ⅚, ten decoding iterations and an AWGN channel. The RCPTC was designed for a 64 kit/S carrier service. FIG. 11 shows that a similar consideration to that connected with FIG. 10 also applies for the dependance of the variance $\sigma^2_{LLR}$ on the occurrence of packet errors. $\sigma^2_{LLR}$ is always greater in defectively decoded packets than $\sigma_{LLR}{}^2$ in the case of correctly decoded packets. Therefore, when the signal/noise ratio $B_E/N_0$ and $\sigma^2_{LLR}$ are known for a packet that has just been checked, a soft decision variable that is related to the probability of a packet error can be easily generated and used for control purposes.

Although the present description relates mainly to the application of the invention to digital mobile radio, the invention is not limited to this; rather, it can be employed with all the stated advantages in digital transmission systems generally, for instance in power-bound systems, optical transmission systems (infrared and laser transmission systems), satellite radio systems, deep space transmission systems, radio-link transmission systems, and radio transmission systems (digital radio or TV).

Indeed, although the present invention has been described with reference to specific embodiments, those of skill in the art will recognize that changes may be made thereto without departing from the spirit and scope of the invention as set forth in the hereafter appended claims.

We claim:

1. A method for transmitting data in a digital transmission system given packet-switched service, and for triggering an ARQ, the method comprising the steps of:
    performing a turbo-coding, for purposes of channel coding, in a turbo-coder at a sender side;
    performing a turbo-decoding with soft decision output signals in a turbo-decoder at a receiver side;
    estimating channel quality by a parameter estimation method;
    determining variances of the soft decision output signals at the turbo-decoder;
    inferring one of a correctness and a defectiveness of the transmitted packet from the channel quality and the variances; and
    triggering a resending of at least part of a defective packet.

2. A method for transmitting data in a digital transmission system given packet-switched service, and for triggering an ARQ as claimed in claim 1, further comprising the steps of:
    using a soft input/soft output symbol estimator at the receiver side; and
    determining the quality of service from the variances of the soft decision output signals.

3. A method for transmitting data in a digital transmission system given packet-switched service, and for triggering an ARQ as claimed in claim 2, the method further comprising the step of:
    computing, from the variances of the soft decision output signals, a bit error rate as a measure of the quality of service.

4. A method for transmitting data in a digital transmission system given packet-switched service, and for triggering an ARQ as claimed in claim 2, the method further comprising the steps of:
    using a MAP symbol estimator at the receiver side; and
    determining the quality of service from the variances of the soft decision output signals.

5. A method for transmitting data in a digital transmission system given packet-switched service, and for triggering an ARQ as claimed in claim 2, the method further comprising the steps of:
    using a Viterbi algorithm for sequence estimation at the receiver side; and
    determining the quality of service from the variances of the soft decision output signals.

6. A method for transmitting data in a digital transmission system give packet-switched service, and for triggering an ARQ as claimed in claim 1, the method further comprising the step of:
    using Berrou's dotting for dotting, wherein only non-systematic information is dotted.

7. A method for transmitting data in a digital transmission system given packet-switched service, and for triggering an ARQ as claimed in claim 1, the method further comprising the step of:
    using UKL dotting for dotting, wherein both systematic information and non-systematic information are dotted.

8. A method for transmitting data in a digital transmission system given packet-switched service, and for triggering an ARQ as claimed in claim 1, the method further comprising the step of:
    utilizing an RCPTC as turbo-code.

9. A method for transmitting data in a digital transmission system given packet-switched service, and for triggering an ARQ as claimed in claim 8, the method further comprising the steps of:
    resending, given a retransmission of the information of a defective packet, at least a part of the information suppressed by the dotting of the RCPTC in the previous transmission;
    inserting the resent information into the existing information at the receiver side; and
    decoding the complete information again.

10. A method for transmitting data in a digital transmission system given packet-switched service, and for triggering an ARQ as claimed in claim 9, the method further comprising the step of:
    sending in a retransmission only bits that are additionally available given the next lowest coding rate as the bits are not dotted.

11. A method for transmitting data in a digital transmission system given packet-switched service, and for triggering an ARQ as claimed in claim 9, the method further comprising the step of:
    repeating each step of the method until at least one of an errorless decoding of the packet has been accomplished and the entire coded information of a packet has been transmitted.

* * * * *